(12) United States Patent
Jo et al.

(10) Patent No.: US 11,807,932 B2
(45) Date of Patent: Nov. 7, 2023

(54) MASK AND METHOD FOR MANUFACTURING MASK

(71) Applicant: Samsung Display Co., Ltd., Yongin-Si (KR)

(72) Inventors: Junho Jo, Seoul (KR); Youngho Park, Suwon-si (KR); Seungyong Song, Suwon-si (KR); Youngchul Lee, Cheonan-si (KR); Youngsuck Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/197,300

(22) Filed: Mar. 10, 2021

(65) Prior Publication Data

US 2022/0025507 A1    Jan. 27, 2022

(30) Foreign Application Priority Data

Jul. 23, 2020   (KR) .......................... 10-2020-0091548

(51) Int. Cl.
  *C23C 14/04* (2006.01)
(52) U.S. Cl.
  CPC .................................. *C23C 14/042* (2013.01)
(58) Field of Classification Search
  CPC .... C23C 14/042; C23C 16/042; H10K 71/166
  See application file for complete search history.

(56) References Cited

U.S. PATENT DOCUMENTS

| | | | |
|---|---|---|---|
| 9,847,485 B2 | 12/2017 | Min | |
| 10,172,558 B2 | 1/2019 | Negi et al. | |
| 10,396,469 B1 | 8/2019 | Fritz et al. | |
| 2002/0025406 A1* | 2/2002 | Kitazume | C23C 14/042 |
| | | | 428/136 |
| 2017/0311411 A1* | 10/2017 | Takizawa | C23C 16/04 |
| 2021/0217956 A1 | 7/2021 | Im et al. | |
| 2021/0217997 A1 | 7/2021 | Kwag et al. | |
| 2021/0277512 A1 | 9/2021 | Kim et al. | |
| 2021/0324508 A1* | 10/2021 | Korneisel | H01L 51/0011 |

FOREIGN PATENT DOCUMENTS

| | | |
|---|---|---|
| KR | 101642041 B1 | 7/2016 |
| KR | 1020170056769 A | 5/2017 |
| KR | 1020210091382 A | 7/2021 |
| KR | 1020210091383 A | 7/2021 |
| KR | 1020210113526 A | 9/2021 |

* cited by examiner

*Primary Examiner* — Alex A Rolland
(74) *Attorney, Agent, or Firm* — CANTOR COLBURN LLP

(57) ABSTRACT

A method for manufacturing a mask includes providing, on a stage, a mask frame in which a plurality of cell openings is defined; providing each of the cell openings with a cell mask material in which a second area and a plurality of first areas are defined, where the second area is disposed around each of the first areas; emitting a laser beam to the second area to harden the second area; and removing the first areas, thereby forming a plurality of cell masks disposed in the cell openings, respectively.

6 Claims, 16 Drawing Sheets

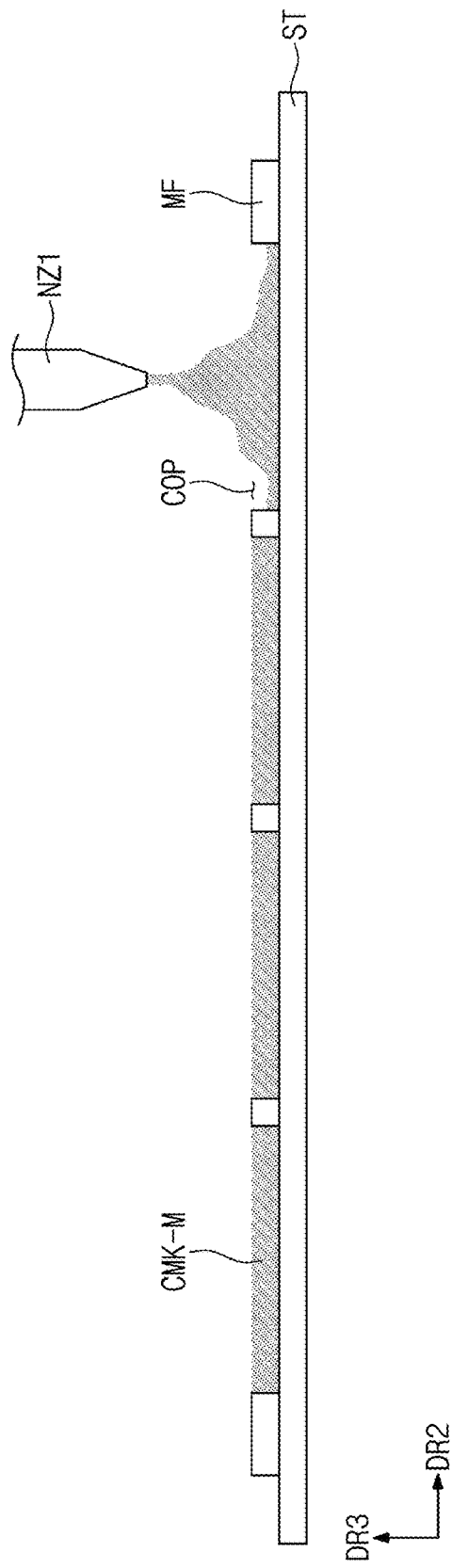
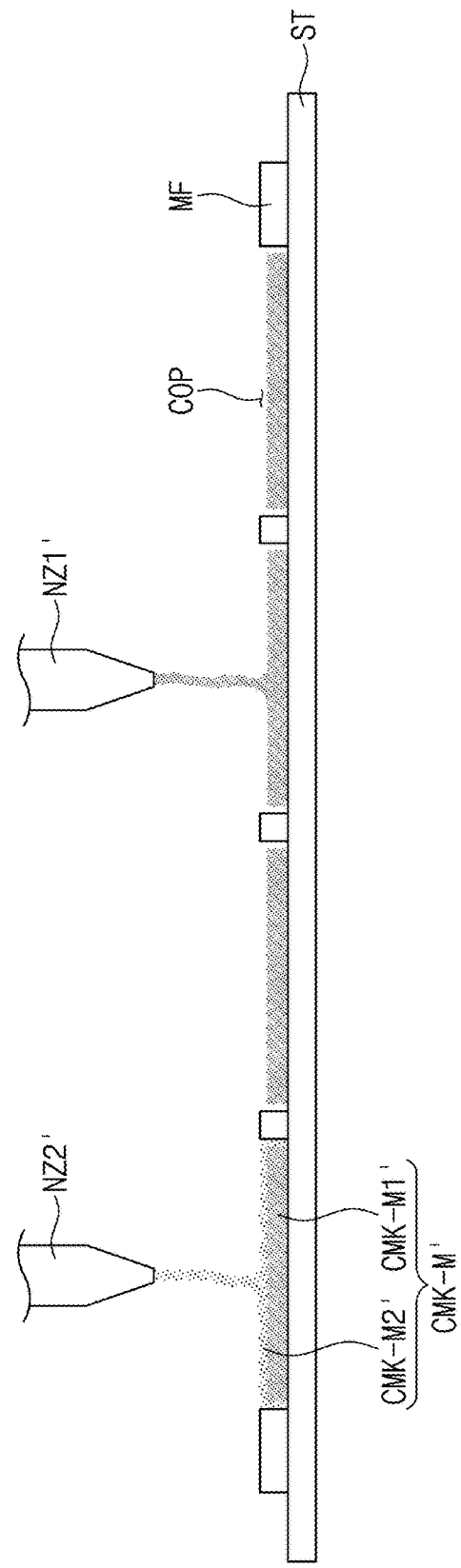

MASK AND METHOD FOR MANUFACTURING MASK

This application claims priority to Korean Patent Application No. 10-2020-0091548, filed on Jul. 23, 2020, and all the benefits accruing therefrom under 35 U.S.C. § 119, the content of which in its entirety is herein incorporated by reference.

BACKGROUND

The present disclosure herein relates to a mask and a method for manufacturing the mask.

A display panel includes a plurality of pixels. Each of the pixels includes a driving element such as a transistor and a display element such as an organic light emitting diode. The display element may be formed by stacking an electrode and a light emitting pattern on a substrate. The light emitting pattern is formed by using a mask in which holes are defined to form the light emitting pattern in a predetermined area. The light emitting pattern may be formed in areas exposed through opening portions.

Technologies for a method for manufacturing a large-area mask have been developed to improve the production yield of display panels.

SUMMARY

The present disclosure provides a mask and a mask manufacturing method in which a cell mask may be directly manufactured in a mask frame.

An embodiment of the inventive concept provides a method for manufacturing a mask. The method includes: providing, on a stage, a mask frame in which a plurality of cell openings is defined; providing each of the cell openings with a cell mask material in which a second area and a plurality of first areas and are defined, where the second area is disposed around each of the first areas; emitting a laser beam to the second area to harden the second area; and removing the first areas, thereby forming a plurality of cell masks disposed in the cell openings, respectively.

In an embodiment of the inventive concept, a method for manufacturing a mask includes: providing, on a stage, a mask frame in which a cell opening is defined, where the cell opening is partitioned into a fourth area and a plurality of third areas, and the fourth area is disposed around each of the third areas; and ejecting a cell mask material to the fourth area of the cell opening.

In an embodiment of the inventive concept, a mask includes: a mask frame in which a plurality of cell openings is defined; and a plurality of cell masks which extend from inner walls of the mask frame which defines the cell openings, where, in a cross-sectional view, a top surface of the mask frame is disposed coplanar with top surfaces of the plurality of cell masks, and a bottom surface of the mask frame is disposed coplanar with bottom surfaces of the plurality of cell masks.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 7A to 7C are views illustratively showing a process for providing a cell mask material to a mask frame illustrated in FIG. 6;

DETAILED DESCRIPTION

Figure 1:
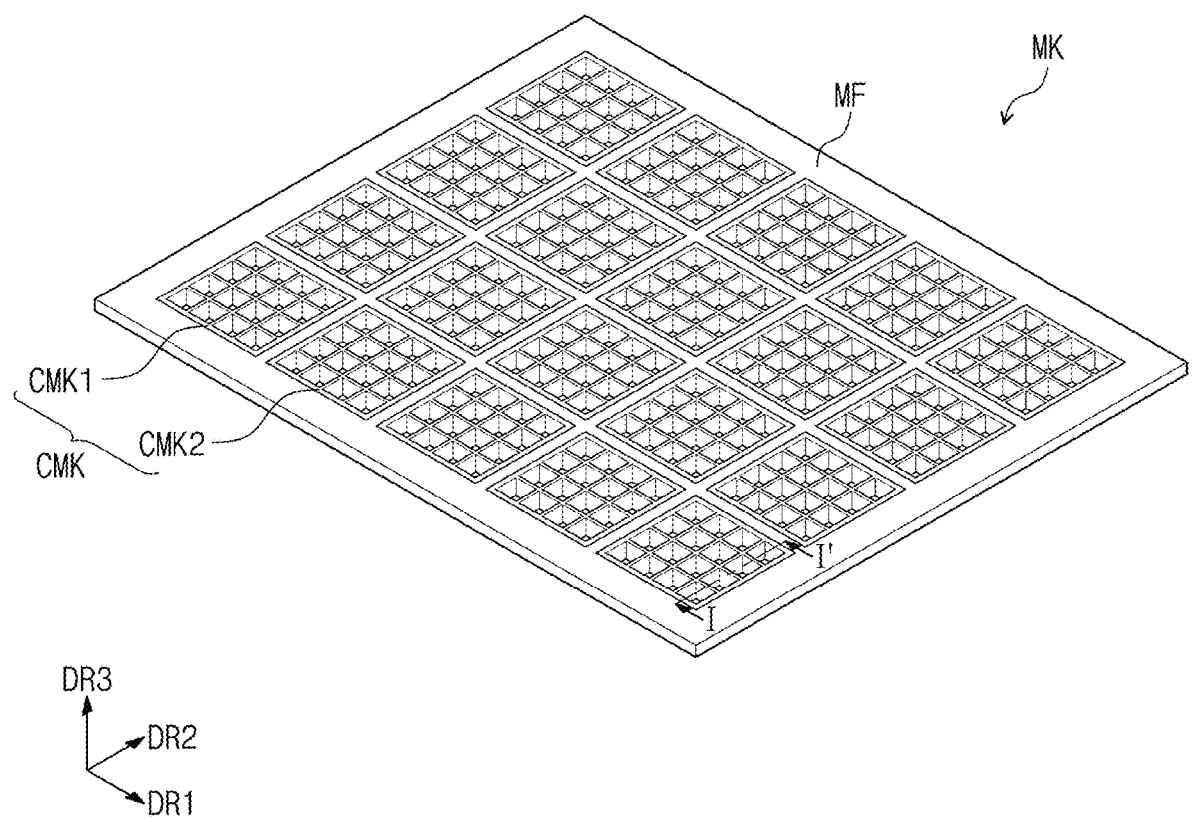
FIG. 1 is a perspective view illustratively showing a mask which is manufactured by a mask manufacturing method according to an embodiment of the inventive concept.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

Like numbers refer to like elements throughout. Also, in the drawings, the thicknesses, ratios, and dimensions of the elements are exaggerated for effective description of the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the present disclosure. The singular forms include the plural forms unless the context clearly indicates otherwise.

Also, terms such as "below", "lower", "above", and "upper" may be used to describe the relationships of the components illustrated in the drawings. These terms have a relative concept, and are described on the basis of the directions indicated in the drawings.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "includes" or "comprises", when used in this specification, specify the presence of stated features, integers, steps, operations, elements, components, or a combination thereof, but do not preclude the presence or addition of one or more other features, integers, steps, operations, elements, components, or combinations thereof.

Hereinafter, embodiments of the inventive concept will be described in detail with reference to the accompanying drawings.

Figure 2:
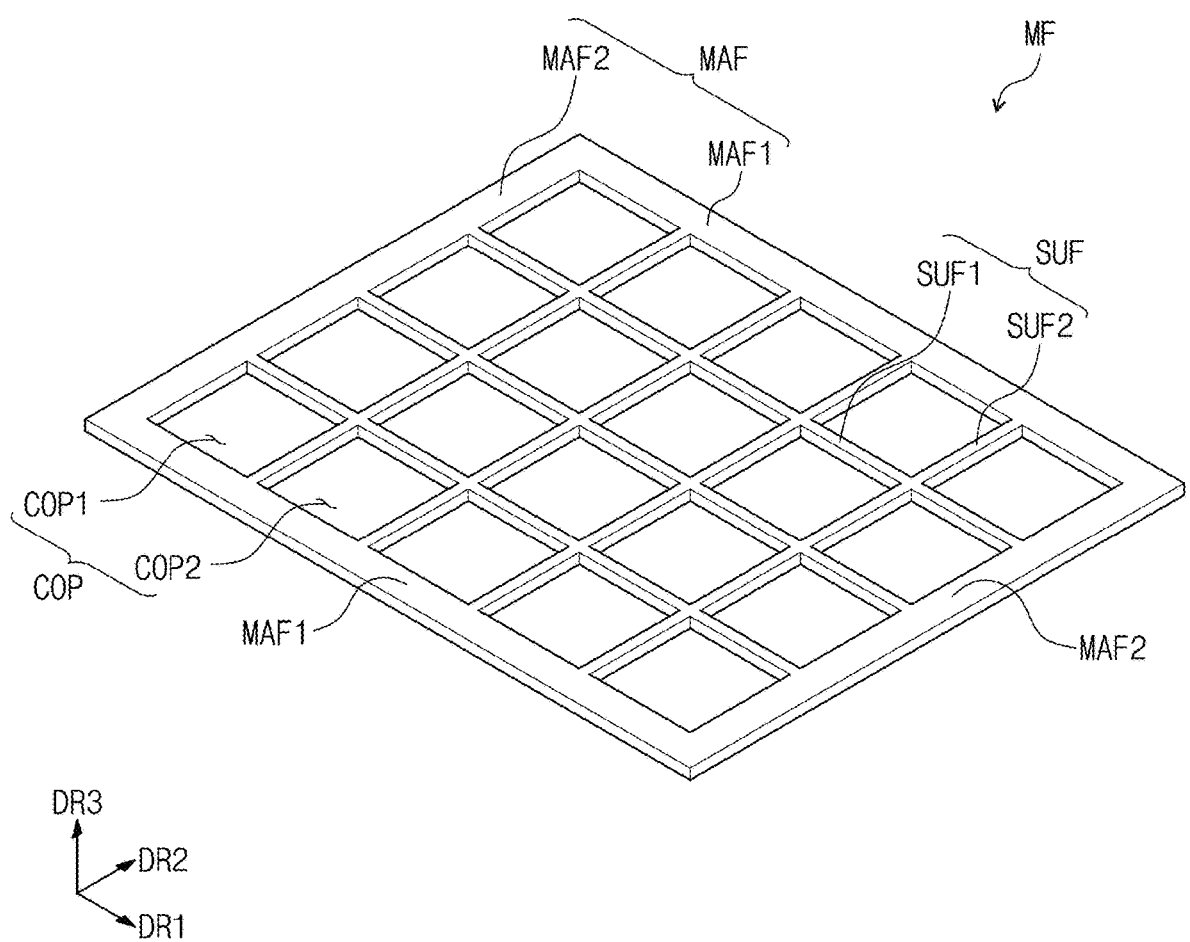
FIG. 2 is a perspective view illustratively showing a mask frame of FIG. 1.
Figure 3:
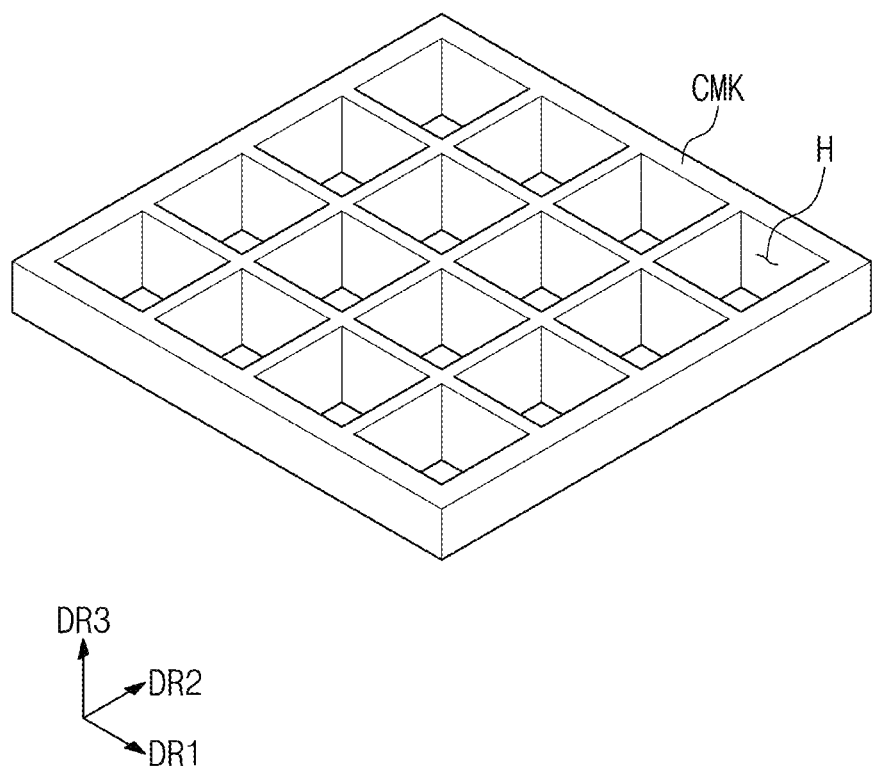
FIG. 3 is a perspective view illustratively showing a cell mask of FIG. 1.

FIG. 1 is a perspective view illustratively showing a mask which is manufactured by a mask manufacturing method according to an embodiment of the inventive concept. FIG. 2 is a perspective view illustratively showing a mask frame of FIG. 1. FIG. 3 is a perspective view illustratively showing a cell mask of FIG. 1.

Referring to FIG. 1, a mask MK may be used in a process for manufacturing a display device. Particularly, the mask MK is disposed on a deposition substrate of the display device and may be used in a process for depositing an organic light emitting element layer on the deposition substrate.

The mask MK may have a rectangular parallelepiped shape. For example, the mask MK may have two long sides (i.e., longitudinal sides) extending in a first direction DR1 and two short sides (i.e., latitudinal sides) extending in a second direction DR2. The second direction DR2 indicates a direction perpendicular to the first direction DR1. However, the shape of the mask MK according to the invention is not limited to that described above.

The mask MK may be a thin plate having a small thickness in a third direction DR3. The third direction DR3 indicates a direction that substantially perpendicularly crosses the plane defined by the first direction DR1 and the second direction DR2. Also, in this specification, the expression of "when viewed in a plan view" may mean a state when viewed in the third direction DR3.

The mask MK may include a mask frame MF and a plurality of cell masks CMK fixed to the mask frame MF. The cell masks CMK may be arranged in the first direction DR1 and the second direction DR2. FIG. 1 illustrates twenty cell masks CMK, but this is merely an example. The number of cell masks CMK according to the invention may change.

The cell masks CMK may include a first cell mask CMK1 and a second cell mask CMK2. When viewed in a plan view, the first cell mask CMK1 may have the same area as the second cell mask CMK2. However, the embodiment of the inventive concept is not limited thereto. The area of the first cell mask CMK1 may be different from the area of the second cell mask CMK2 in another embodiment. That is, the mask MK may include cell masks CMK having different sizes.

Referring to FIG. 2, a cell opening COP may be defined in the mask frame MF. The cell opening COP may be provided in plurality. The cell openings COP may be arranged in the first direction DR1 and the second direction DR2.

The cell openings COP may include a first cell opening COP1 and a second cell opening COP2. The area of the first cell opening COP1 may be the same as the area of the second cell opening COP2. However, the embodiment of the inventive concept is not limited thereto, and the area of the first cell opening COP1 may be different from the area of the second cell opening COP2.

According to an embodiment of the inventive concept, the mask frame MF may include a main frame MAF and a sub frame SUF disposed inside the main frame MAF. The cell openings COP may be defined by the main frame MAF and the sub frame SUF.

The main frame MAF may have a rectangular ring shape. Particularly, the main frame MAF may include two first main frames MAF1 and two second main frames MAF2. Each of the first main frames MAF1 may extend in the first direction DR1. The first main frames MAF1 may be spaced apart from each other in the second direction DR2.

Each of the second main frames MAF2 may extend in the second direction DR2. The second main frames MAF2 may be spaced apart from each other in the first direction DR1. The both ends of each of the second main frames MAF2 may be connected to the first main frames MAF1. The first main frames MAF1 and the second main frames MAF2 may be integrated with each other. That is, the first main frames MAF1 and the second main frames MAF2 may be monolithic.

The sub frame SUF may be disposed inside the main frame MAF. Particularly, the sub frame SUF may include a first sub frame SUF1 and a second sub frame SUF2. Each of the first sub frame SUF1 and the second sub frame SUF2 may be provided in plurality.

Each of the first sub frames SUF1 may extend in the first direction DR1. The first sub frames SUF1 may be spaced apart from each other in the second direction DR2. The distance between the neighboring first sub frames SUF1 in the second direction DR2 may be constant or variable.

The both ends of each of the first sub frames SUF1 may be connected to the second main frames MAF2. FIG. 2 illustrates three first sub frames SUF1, but this is merely an example. The number of first sub frames SUF1 according to the invention is not limited thereto. When viewed in a plan view, the width of each of the first sub frames SUF1 in the second direction DR2 may be less than the width of the main frame MAF (i.e., each of the width of the first main frame MAF1 in the second direction DR2 and the width of the second main frame MAF2 in the first direction DR1).

Each of the second sub frames SUF2 may extend in the second direction DR2. The second sub frames SUF2 may be spaced apart from each other in the first direction DR1. The distance between the neighboring second sub frames SUF2 in the first direction DR1 may be constant or variable.

The both ends of each of the second sub frames SUF2 may be connected to the first main frames MAF1. FIG. 2 illustrates four second sub frames SUF2, but this is merely an example. The number of second sub frames SUF2 according to the invention is not limited thereto. When viewed in a plan view, the width of each of the second sub frames SUF2 may be less than the width of the main frame MAF. That is, the width of each of the second sub frames SUF2 in the first direction DR1 may be less than each of the width of the first main frame MAF1 in the second direction DR2 and the width of the second main frame MAF2 in the first direction DR1

The first sub frames SUF1 and the second sub frames SUF2 may cross each other. The cell openings COP may be defined by the first sub frames SUF1 and the second sub frames SUF2. By the first sub frames SUF1 and the second sub frames SUF2, a grid pattern may be formed in the mask frame MF.

The mask frame MF may include a metal material or a nonmetallic material. For example, the mask frame MF may include a metal material (for example, titanium, aluminum, cobalt, iron, carbon fiber, a nickel alloy, or the like), a nonmetallic material (for example, polyester resin, acrylonitrile butadiene styrene copolymer resin, or ceramic resin), or a material having a combination thereof. However, the material of the mask frame MF according to the invention is not limited thereto.

Referring to FIG. 3, the cell masks CMK may be disposed in the cell openings COP defined in the mask frame MF of FIG. 2. Each of the cell masks CMK may be attached to the mask frame MF.

The shape of the cell mask CMK may correspond to the shape of each of the cell openings COP illustrated in FIG. 2. When viewed in a plan view, the cell mask CMK may have a quadrangular shape. The cell mask CMK may have two sides extending in the first direction DR1 and two sides extending in the second direction DR2.

A deposition hole H may be defined in the cell mask CMK. In the embodiment, the deposition hole H may be provided in plurality. The deposition holes H may be arranged in the first direction DR1 and the second direction DR2. The deposition holes H may be spaced apart from each other in the first direction DR1 or the second direction DR2. FIG. 3 illustrates that 16 deposition holes H are defined in one cell mask CMK, but the embodiment of the inventive concept is not limited thereto. Actually, the number of deposition holes H defined in the one cell mask CMK may be greater than 16 in another embodiment.

Figure 4A:
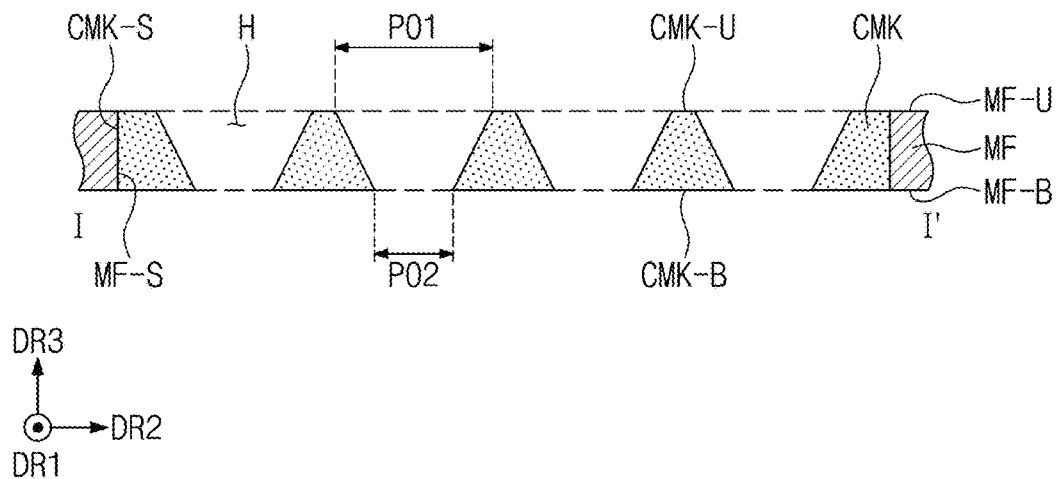
FIGS. 4A to 4C are views illustratively showing cross-sections taken along line I-I' of FIG. 1.
Figure 4B:
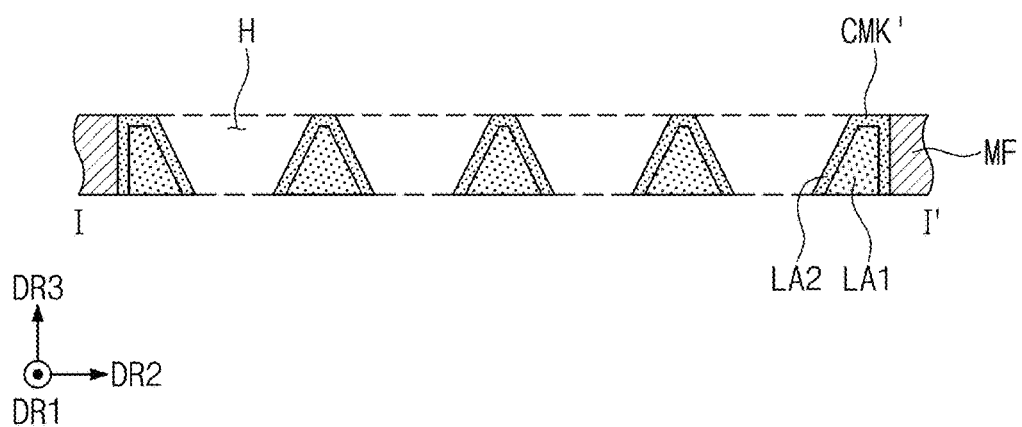
Figure 4C:
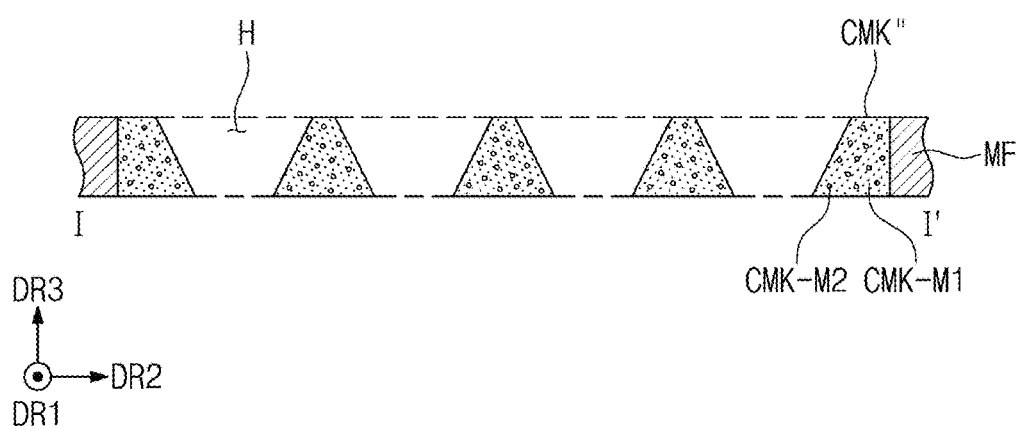

FIGS. 4A to 4C are views illustratively showing cross-sections taken along line I-I' of FIG. 1. The cell mask CMK may have one of cross-sectional shapes illustrated in FIGS. 4A to 4C.

Referring to FIG. 4A, the cell mask CMK may be fixed to the mask frame MF. Particularly, an outer wall CMK-S of the cell mask CMK may be in contact with an inner wall MF-S of the mask frame MF. During a process for manufacturing the mask MK, the outer wall CMK-S of the cell mask CMK may be attached to the inner wall MF-S of the mask frame MF. Here, the inner wall MF-S of the mask frame MF may be an inner wall of one of the mask frame MAF and the sub frame SUF.

With respect to the third direction DR3, the cell mask CMK may have the same thickness as the mask frame MF in the third direction DR3. Particularly, a top surface CMK-U of the cell mask CMK may be positioned coplanar with a top surface MF-U of the mask frame MF, and a bottom surface CMK-B of the cell mask CMK may be positioned coplanar with a bottom surface MF-B of the mask frame MF. Consequently, there may be no height difference between the cell mask CMK and the mask frame MF.

When viewed in a cross-sectional view, the width of the deposition hole H may change depending on a height of the location measuring the width. For example, when viewed in the first direction DR1, a first section PO1 of the deposition hole H may have a width in the second direction DR2 greater than a width of a second section PO2 in the second direction DR2. The first section PO1 defines an upper portion of the deposition hole H, and the second section PO2 defines a lower portion of the deposition hole H. Due to such a shape of the deposition hole H, the inner walls of the cell mask CMK adjacent to the deposition hole H may form a predetermined angle with respect to the second direction DR2 (or the first direction DR1). That is, the inner walls of the cell mask CMK adjacent to the deposition hole H may be inclined with respect to the third direction DR3.

The cell mask CMK may include a metal material or a nonmetallic material. For example, the cell mask CMK may include a metal material (for example, titanium, aluminum, cobalt, iron, carbon fiber, a nickel alloy, or the like), a nonmetallic material (for example, polyester resin, acrylonitrile butadiene styrene copolymer resin, or ceramic resin), or a material having a combination thereof. However, the material of the cell mask CMK is not limited thereto.

Referring to FIG. 4B, the cell mask CMK' may include a plurality of layers. For example, the cell mask CMK' may include a first cell mask layer LA1 and a second cell mask layer LA2 disposed on the first cell mask layer LA1. The first cell mask layer LA1 may include a first cell mask material, and the second cell mask layer LA2 may include a second cell mask material. The first cell mask material may include a material different from the second cell mask material.

In an embodiment, for example, in a case where the first cell mask material is a metal material, the second cell mask material may be a nonmetallic material. Alternatively, in a case where the first material is a nonmetallic material, the second material may be a metal material.

Referring to FIG. 4C, the cell mask CMK" may include at least two types of materials. For example, the cell mask CMK" may include a first cell mask material CMK-M1 as a base material and a second cell mask material CMK-M2 as an additive material. That is, the amount of the first cell mask material CMK-M1 is dominant in the mixed cell mask material CMK-M" compared to the amount of the second cell mask material CMK-M2. In an embodiment, the second cell mask material CMK-M2 may be dispersed in the first cell mask material CMK-M1 in the mixed cell mask material CMK-M". The first cell mask material CMK-M1 may include a material different from the material of the second cell mask material CMK-M2. For example, in a case where the first cell mask material CMK-M1 is a metal material, the second cell mask material CMK-M2 may be a nonmetallic material. In a case where the first cell mask material CMK-M1 is a nonmetallic material, the second cell mask material CMK-M2 may be a metal material.

The mask MK that includes the mask frame MF and the cell mask CMK illustrated in FIG. 1 may be manufactured through 3D (i.e., three dimensional) printing. Hereinafter, a mask manufacturing method according to an embodiment of the inventive concept will be described.

Figure 5:
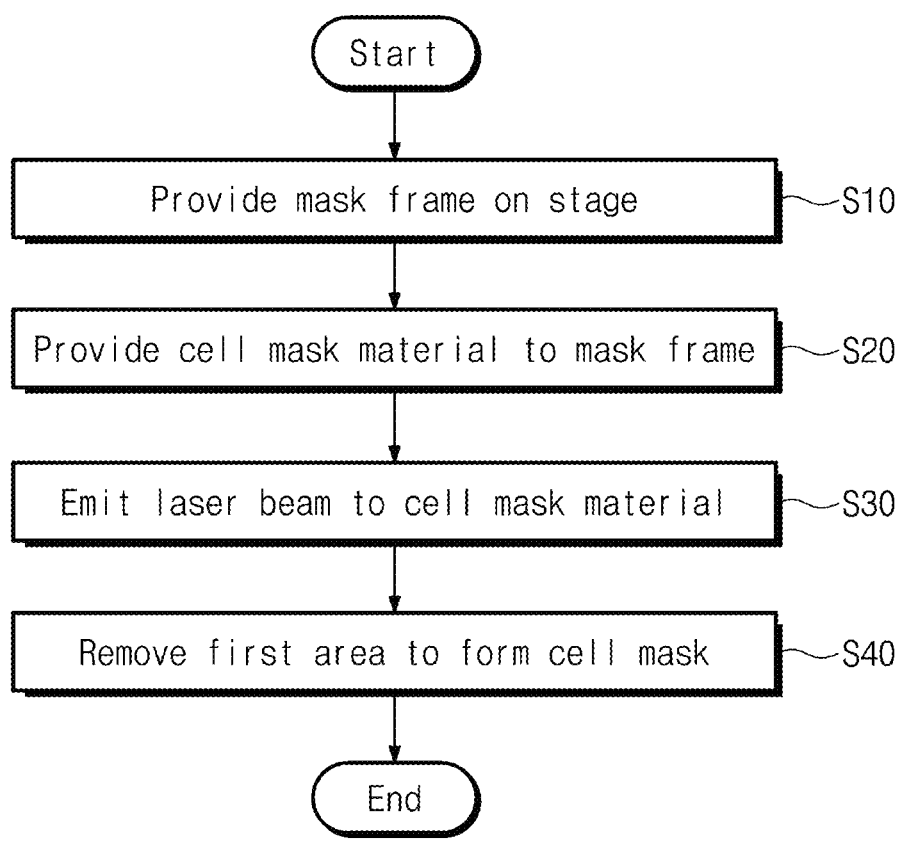
FIG. 5 is a flowchart showing a mask manufacturing method according to an embodiment of the inventive concept.

FIG. 5 is a flowchart showing a mask manufacturing method according to an embodiment of the inventive concept.

Figure 6:
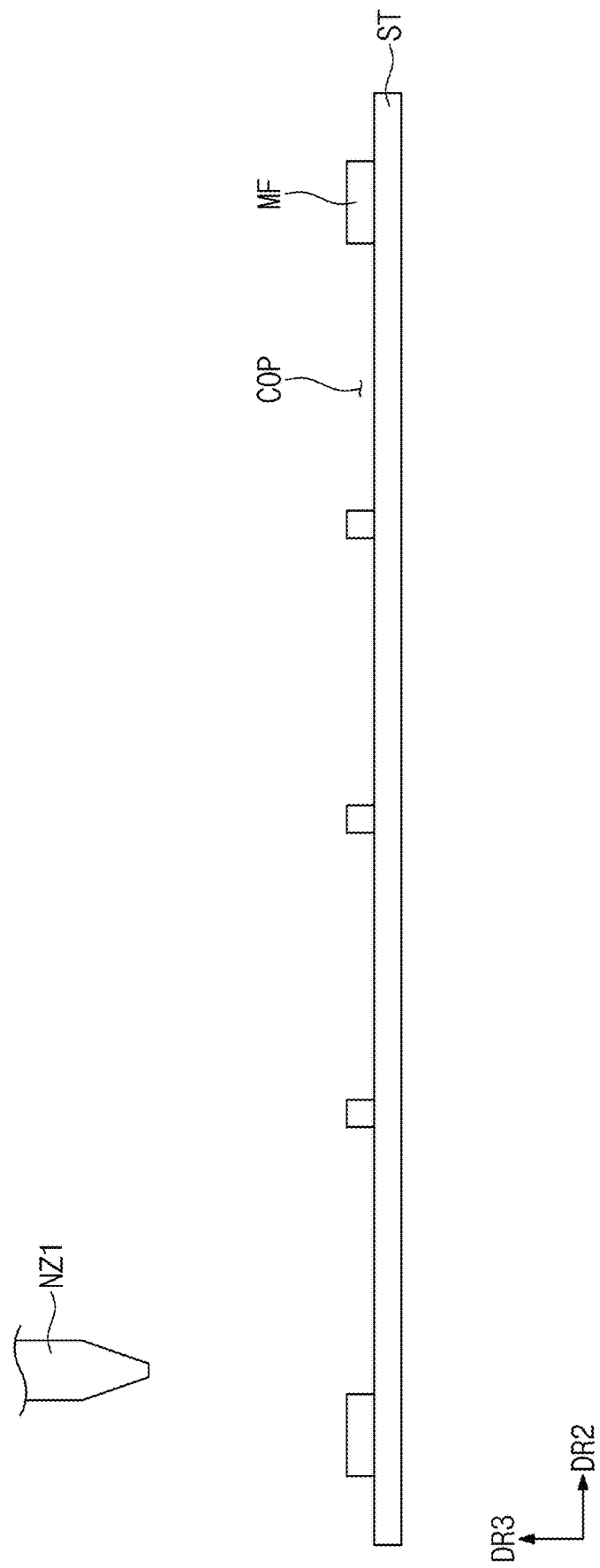
FIG. 6 is a view illustratively showing a mask frame disposed on a stage.
Figure 7C:
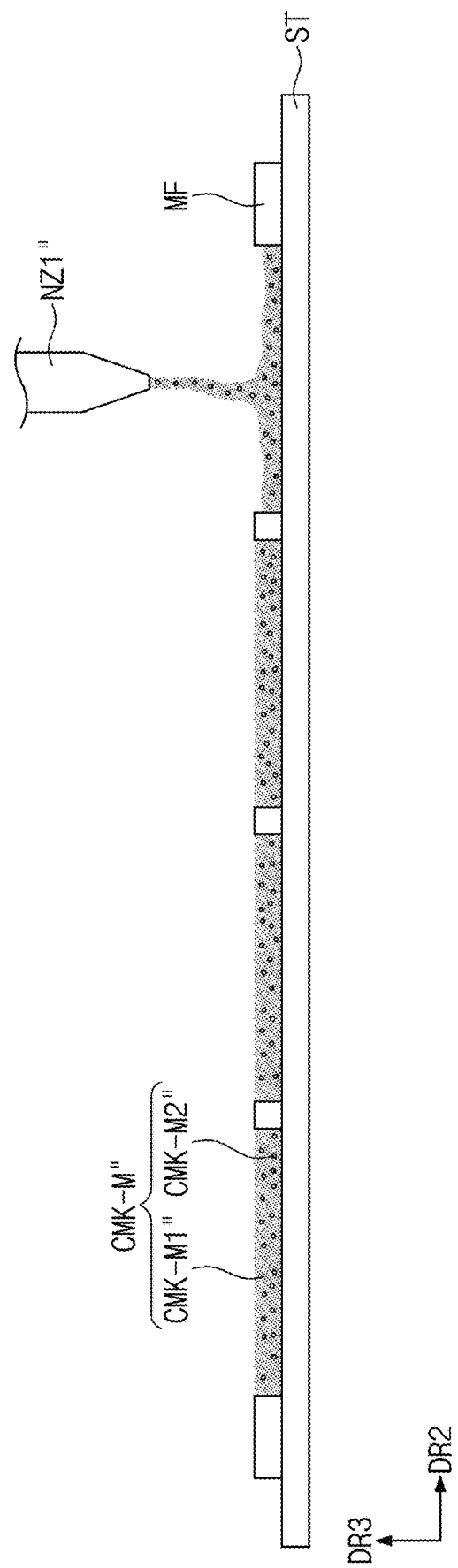

FIG. 6 is a view illustratively showing a mask frame disposed on a stage. FIGS. 7A to 7C are views illustratively showing a process for providing a cell mask material to the mask frame illustrated in FIG. 6.

Referring to FIGS. 5 and 6, in a process (S10), a mask frame MF may be provided on a stage ST. The mask frame MF illustrated in FIG. 6 may have substantially the same structure as the mask frame MF illustrated in FIG. 2.

According to an embodiment of the inventive concept, a first nozzle NZ1 may be disposed above the mask frame MF.

The first nozzle NZ1 may move in a horizontal direction. For example, the first nozzle NZ1 may move in a first direction DR1 and a second direction DR2.

Referring to FIGS. 5 and 7A, in a process (S20), a cell mask material CMK-M may be provided into cell openings COP defined in the mask frame MF. The first nozzle NZ1 may eject the cell mask material CMK-M while moving in the horizontal direction (the first direction DR1 or the second direction DR2).

The cell mask material CMK-M may have flowability. For example, the cell mask material CMK-M may be a thermoplastic material and may be accommodated in the first nozzle NZ1 in a heated state. The cell mask material CMK-M illustrated in FIG. 7A may have one of a metal material or a nonmetallic material. A portion of the cell mask material CMK-M provided in each of the cell openings COP may be in contact with an inner wall MF-S of the mask frame MF.

FIG. 7A illustrates a method in which one first nozzle NZ1 ejects the cell mask material CMK-M while moving in the horizontal direction, but the embodiment of the inventive concept is not limited thereto. For example, a method, in which a plurality of nozzles simultaneously ejects the cell mask material CMK-M into the plurality of cell openings COP, is also possible.

Referring to FIGS. 5 and 7B, in the process (S20), a plurality of cell mask layers may be formed in the cell opening COP.

Particularly, a first nozzle NZ1' may provide a first cell mask material CMK-M1' to the cell openings COP. The first cell mask material CMK-M1' may have flowability. The first nozzle NZ1' may eject the first cell mask material CMK-M1' while moving in the second direction DR2 (or the first direction DR1). Subsequently, the first cell mask material CMK-M1' may be hardened to form a first cell mask layer, which will be described later.

A second nozzle NZ2' may provide a second cell mask material CMK-M2' to the cell openings COP. The second nozzle NZ2' may eject the second cell mask material CMK-M2' while moving in the second direction DR2 (or the first direction DR1).

The second cell mask material CMK-M2' may have flowability. The second nozzle NZ2' may eject the second cell mask material CMK-M2' on the first cell mask material CMK-M1' disposed in the cell opening COP. Subsequently, the second cell mask material CMK-M2' may be hardened to form a second cell mask layer.

The first cell mask material CMK-M1' may include a material different from the second cell mask material CMK-M2'. For example, when the first cell mask material CMK-M1' is a metal material, the second cell mask material CMK-M2' may be a nonmetallic material. Alternatively, when the first cell mask material CMK-M1' is a nonmetallic material, the second cell mask material CMK-M2' may be a metal material.

Referring to FIGS. 5 and 7C, in a process (S20), a cell mask material CMK-M" may be a mixture including different types of materials. For example, the cell mask material CMK-M" may be a material in which a first cell mask material CMK-M1" and a second cell mask material CMK-M2" are mixed.

The first cell mask material CMK-M1" may be a base material. The second cell mask material CMK-M2" may be a material added to the first cell mask material CMK-M1". That is, the amount of the first cell mask material CMK-M1" is dominant in the mixed cell mask material CMK-M" compared to the amount of the second cell mask material CMK-M2". In an embodiment, the second cell mask material CMK-M2" may be dispersed in the first cell mask material CMK-M1" in the mixed cell mask material CMK-M". The first cell mask material CMK-M1" may include a material different from the second cell mask material CMK-M2".

In an embodiment, for example, when the first cell mask material CMK-M1" is a metal material, the second cell mask material CMK-M2" may be a nonmetallic material. Alternatively, when the first cell mask material CMK-M1" is a nonmetallic material, the second cell mask material CMK-M2" may be a metal material.

A first nozzle NZ1" may provide the cell openings COP with the cell mask material CMK-M" in which the first cell mask material CMK-M1" and the second cell mask material CMK-M2" are mixed.

Figure 8:
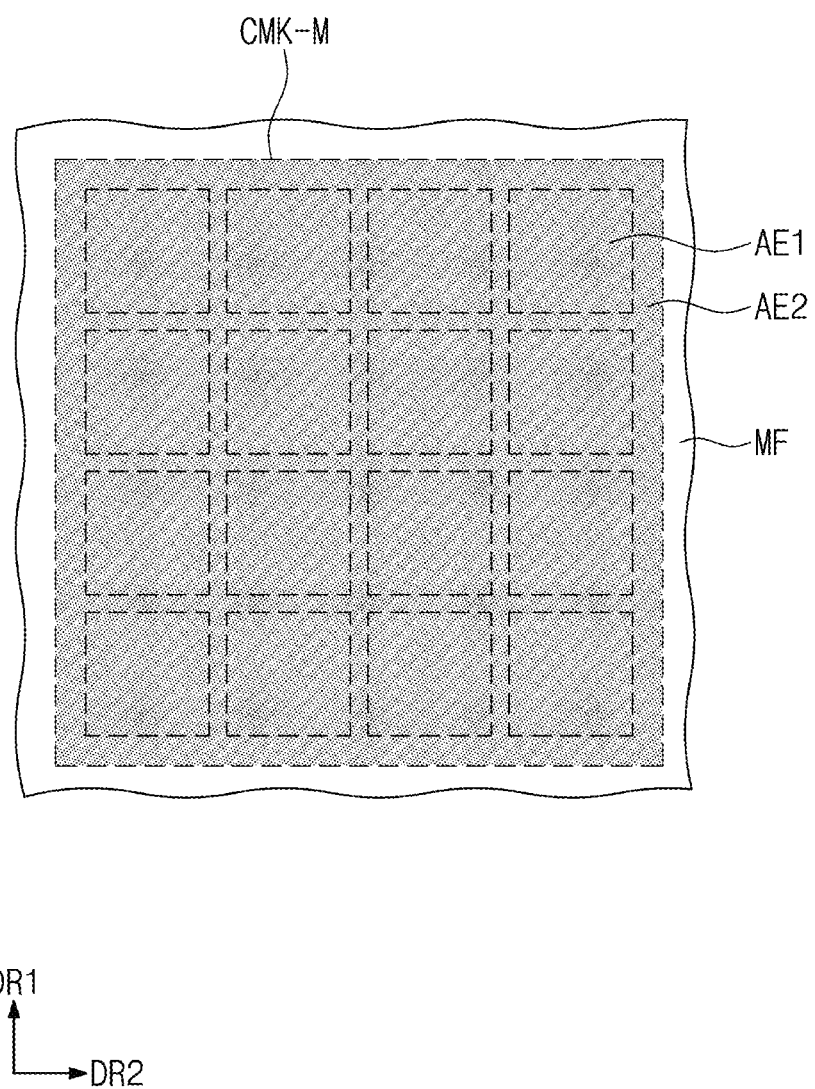
FIG. 8 is a plan view illustratively showing a state in which a cell mask material of FIG. 7A is viewed from above.

FIG. 8 is a plan view illustratively showing a state in which the cell mask material of FIG. 7A is viewed from above. The cell mask material CMK-M illustrated in FIG. 8 may be one of the cell mask materials CMK-M, CMK-M', and CMK-M" illustrated in FIGS. 7A to 7C, respectively. Hereinafter, however, for convenience of description, the cell mask material CMK-M illustrated in FIG. 8 may be the same as the cell mask material CMK-M illustrated in FIG. 7A.

Referring to FIG. 8, a first area AE1 and a second area AE2 may be defined in the cell mask material CMK-M. The first area AE1 and the second area AE2 may be virtual areas for guiding a laser process described later.

Particularly, the first area AE1 may be provided in plurality. The first areas AE1 may be arranged in the first direction DR1 and the second direction DR2. Each of the first areas AE1 may have a quadrangular shape.

The shape of the first area AE1 may have a shape corresponding to the deposition hole H illustrated in FIGS. 3 and 4A. The second area AE2 may surround each of the first areas AE1. The second area AE2 may have a shape corresponding to the cell mask CMK illustrated in FIGS. 3 and 4A.

Figure 9:
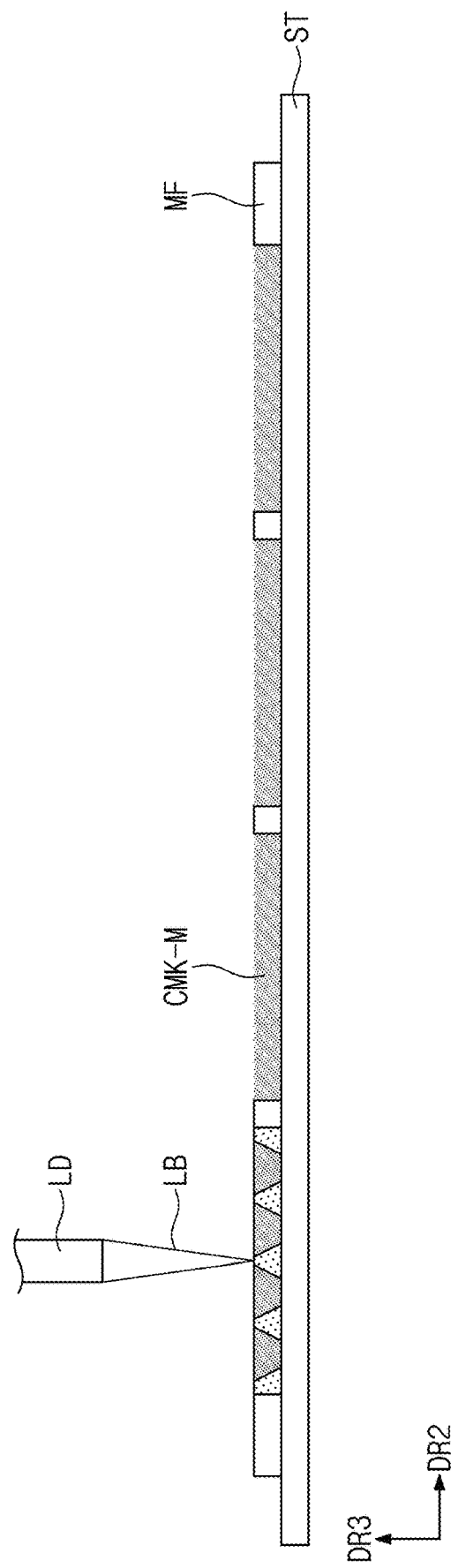
FIG. 9 is a view illustrating a process for emitting a laser beam to a cell mask material illustrated in FIG. 7A.
Figure 10:
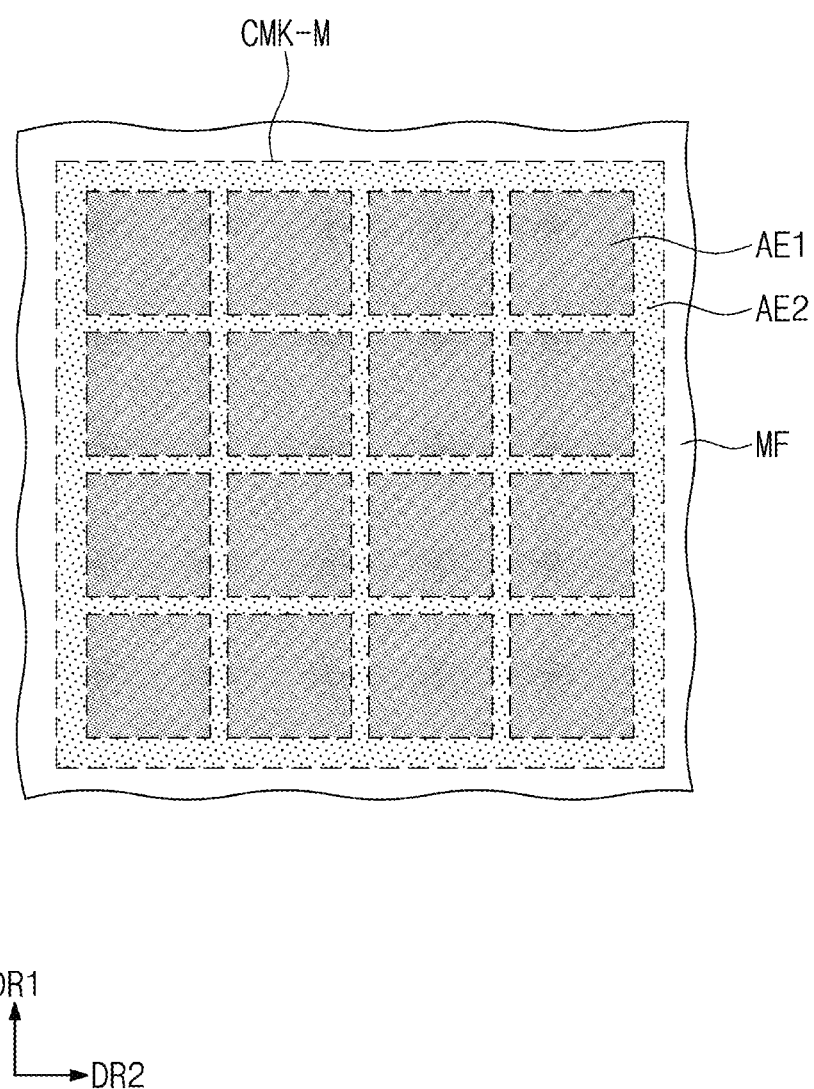
FIG. 10 is a plan view illustratively showing a state after the laser beam is emitted to a cell mask material illustrated FIG. 7A.

FIG. 9 is a view illustrating a process for emitting a laser beam to the cell mask material illustrated in FIG. 7A. FIG. 10 is a plan view illustratively showing a state after the laser beam is emitted to the cell mask material illustrated FIG. 7A.

Referring to FIGS. 5, 8, and 10, in a process (S30), a laser beam LB may be emitted to the cell mask material CMK-M. Particularly, a laser device LD may be disposed above the cell mask material CMK-M.

The laser device LD may emit the laser beam LB to the second area AE2 of the cell mask material CMK-M. The laser beam LB may be emitted from a point source or an area source. The laser device LD may not emit the laser beam LB to the first area AE1 of the cell mask material CMK-M.

The second area AE2 may be hardened by the laser beam LB. Here, a portion of the second area AE2 adjacent to the mask frame MF may be hardened while being attached to the mask frame MF. The first area AE1 may not be hardened since the laser device LD may not emit the laser beam LB to the first area AE1.

Figure 11:
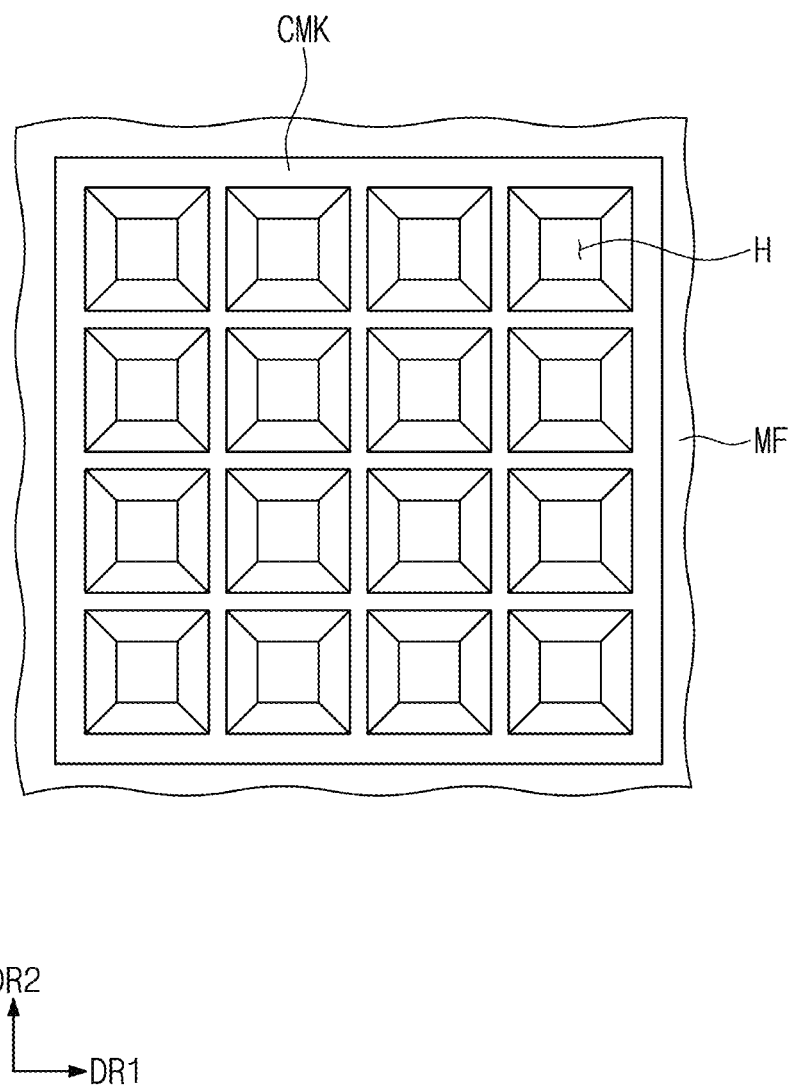
FIG. 11 is a plan view illustratively showing a state in which a first area is removed from a cell mask material illustrated in FIG. 10.

FIG. 11 is a plan view illustratively showing a state in which the first area is removed from the cell mask material illustrated in FIG. 10.

Referring to FIGS. 5, 10, and 11, in a process (S40), a cell mask CMK may be formed by removing the first areas AE1 from the cell mask material CMK-M. The first areas AE1 are not hardened and thus may be removed. In an embodiment, for example, the first areas AE1 may be removed through a washing process. However, a method for removing the first areas AE1 according to the invention is not limited thereto.

Deposition holes H may be defined by spaces from which the first areas AE1 are removed. The deposition holes H illustrated in FIG. 11 may have the same shape as the deposition holes H illustrated in FIGS. 3 and 4A. Consequently, the cell mask CMK illustrated in FIG. 11 may be the cell mask CMK illustrated in FIG. 3.

In the mask manufacturing method according to an embodiment of the inventive concept, the mask MK is manufactured by directly providing the cell mask material CMK-M into the cell openings COP defined in the mask frame MF and then hardening the same. Thus, a mask manufacturing process may be simplified.

In the mask manufacturing method according to an embodiment of the inventive concept, even in the case that the mask MK is partially damaged, maintenance of the mask MK may be easily performed by applying a cell mask material to the damaged portion and hardening the same.

According to an embodiment of the inventive concept, since the cell masks CMK in units of cells are formed in the mask frame MF, the mask may be replaced or repaired in units of cells.

The method for manufacturing the cell masks CMK disposed in the mask frame MF has been mainly described, but the mask frame MF may be manufactured through the similar method.

In an embodiment, for example, prior to the process (S10), a mask frame material may be provided on the stage ST in the same shape as the mask frame MF illustrated in FIG. 2. Subsequently, a laser beam is emitted to the mask frame material to harden the mask frame material, and thus, the mask frame MF illustrated in FIG. 2 may be formed.

Hereinafter, mask manufacturing methods according to other embodiments of the inventive concept will be described.

Figure 12A:
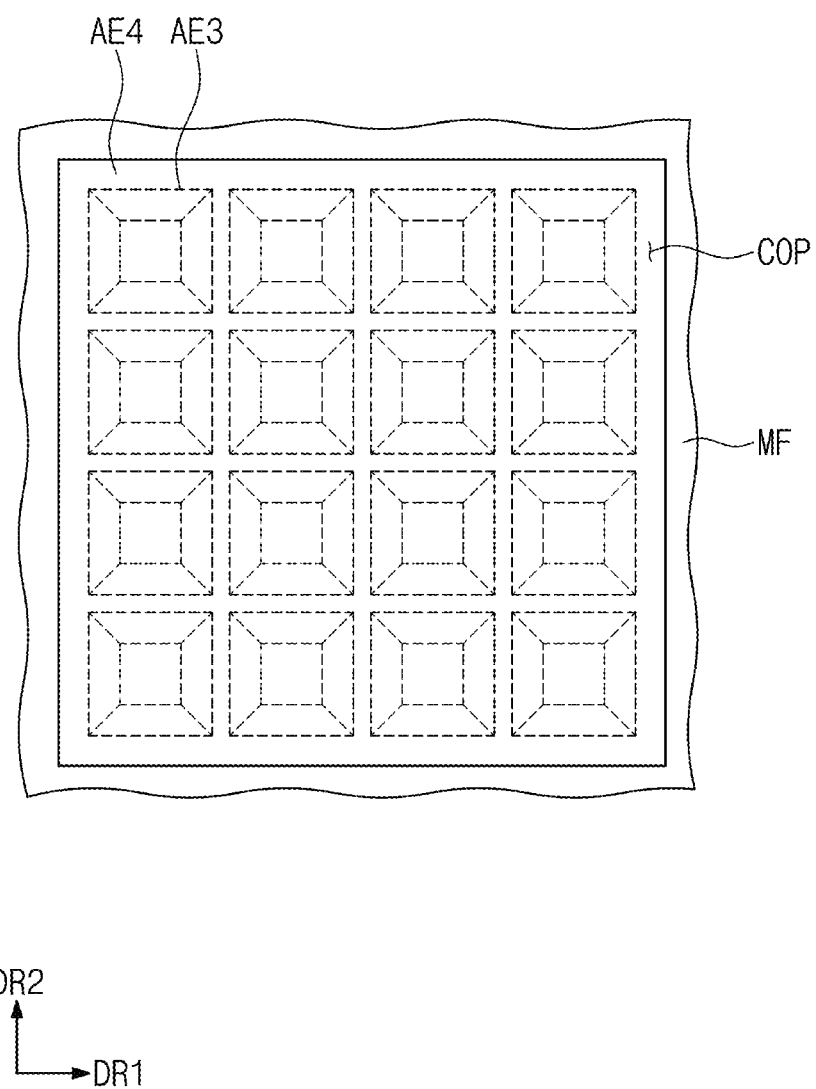
FIGS. 12A and 12B are views illustratively showing a mask manufacturing method according to another embodiment of the inventive concept.
Figure 12B:
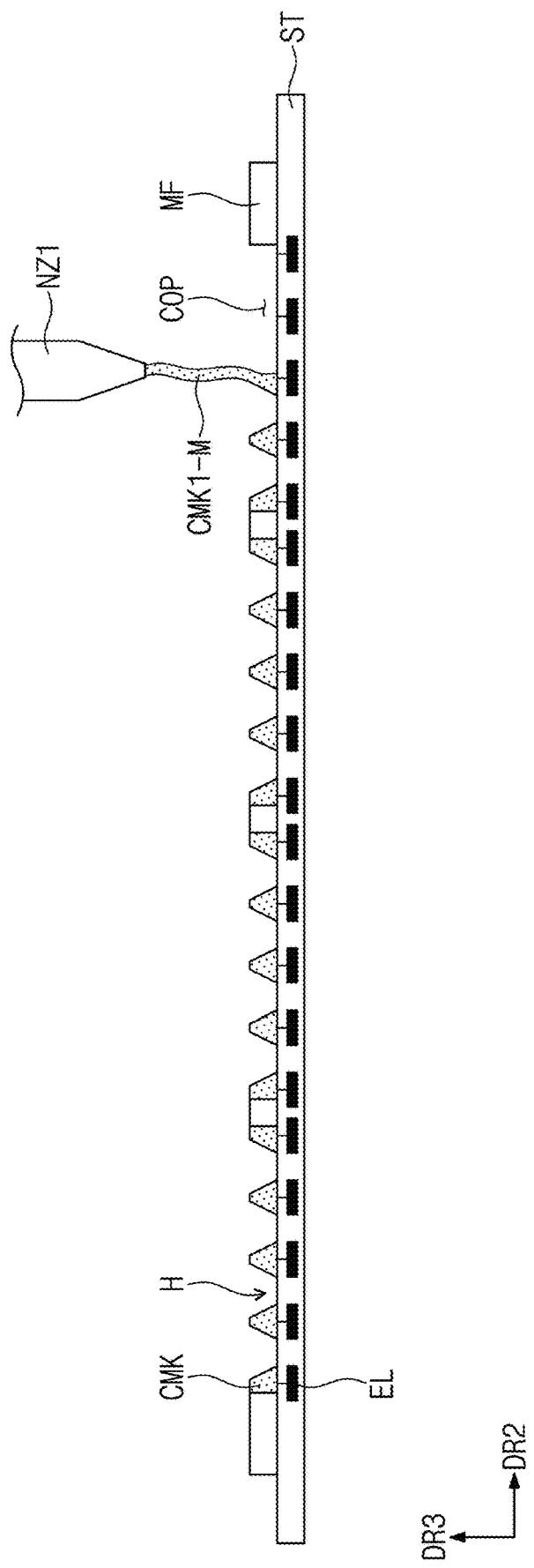

FIGS. 12A and 12B are views illustratively showing a mask manufacturing method according to another embodiment of the inventive concept. The mask manufacturing method shown in FIGS. 12A and 12B is different from the embodiment described above in that a deposition hole H is formed in a cell mask material CMK1-M during a process for providing the cell mask material CMK1-M onto a stage ST.

Although not shown, before the cell mask material CMK1-M is provided, a mask frame MF in which cell openings COP are defined is provided on the stage, and a first nozzle NZ1 that accommodates the cell mask material CMK1-M therein may be disposed above the cell openings COP.

Referring to FIGS. 12A and 12B, a third area AE3 and a fourth area AE4 may be defined in each of the cell openings COP. The third area AE3 and the fourth area AE4 may be virtual areas defined in the cell opening COP.

The third area AE3 may have the same shape as the deposition hole H illustrated in FIG. 3. Particularly, the third area AE3 may be provided in plurality. The third areas AE3 may be arranged in a first direction DR1 and a second direction DR2. When viewed in a plan view, each of the third areas AE3 may have a quadrangular shape.

The fourth area AE4 may have the same shape as the cell mask CMK illustrated in FIG. 3. Particularly, the fourth area AE4 may surround each of the third areas AE3.

A first nozzle NZ1 ejects the cell mask material CMK1-M only to the fourth area AE4. The first nozzle NZ1 does not eject the cell mask material CMK1-M to the third area AE3. Accordingly, the cell mask material CMK1-M is ejected into the cell opening COP, and at the same time, a deposition hole H may be formed in the third area AE3.

In the embodiment, the cell mask material CMK1-M may be hardened when ejected from the first nozzle NZ1. Consequently, the cell mask material CMK1-M provided in the cell opening COP may become a part of a cell mask CMK after a predetermined time elapse.

Since the mask manufacturing method according to this embodiment does not require additional process for hardening the cell mask material CMK1-M (e.g., hardened by a laser beam), a process for manufacturing the mask may be further simplified and a manufacturing time may be reduced compared to the mask manufacturing method according to the embodiment of FIG. 9.

Referring to FIG. 12B, electrodes EL may be disposed inside the stage ST. The electrodes EL may overlap the fourth area AE4 illustrated in FIG. 12A in a plan view. The electrodes EL may not overlap the third areas AE3 illustrated in FIG. 12A in a plan view.

The electrodes EL may generate electrostatic force. Due to the electrostatic force, the cell mask material CMK1-M may be attracted to the top surface of the stage ST. Consequently, according to the embodiment, the speed at which the first nozzle NZ1 ejects the cell mask material CMK1-M is increased, and thus, the manufacturing time may be further reduced.

Figure 13:
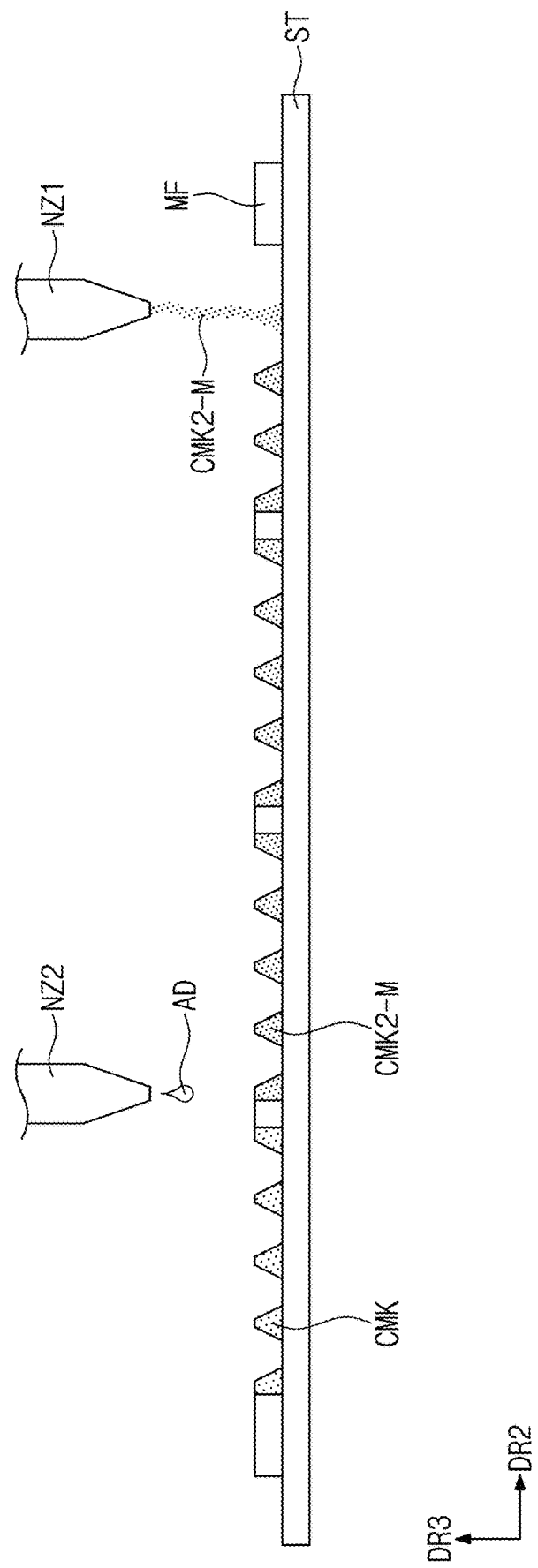
FIG. 13 is a view illustratively showing a mask manufacturing method according to still another embodiment of the inventive concept.

FIG. 13 is a view illustratively showing a mask manufacturing method according to still another embodiment of the inventive concept. In the mask manufacturing method illustrated in FIG. 13, a first nozzle NZ1 may provide a cell mask material CMK2-M in cell openings COP in the same manner as the method illustrated in FIGS. 12A and 12B. That is, the first nozzle NZ1 ejects the cell mask material CMK2-M only to the fourth area AE4, and at the same time, may form a deposition hole H in the third area AE3.

However, in the embodiment, the cell mask material CMK2-M may be a powder form. The cell mask material CMK2-M in the form of powder may be stacked inside the cell openings COP by the first nozzle NZ1.

A second nozzle NZ2 may provide an additive AD onto the cell mask material CMK2-M stacked by the first nozzle NZ1. The additive AD may trigger a chemical reaction to harden the cell mask material CMK2-M.

Figure 14:
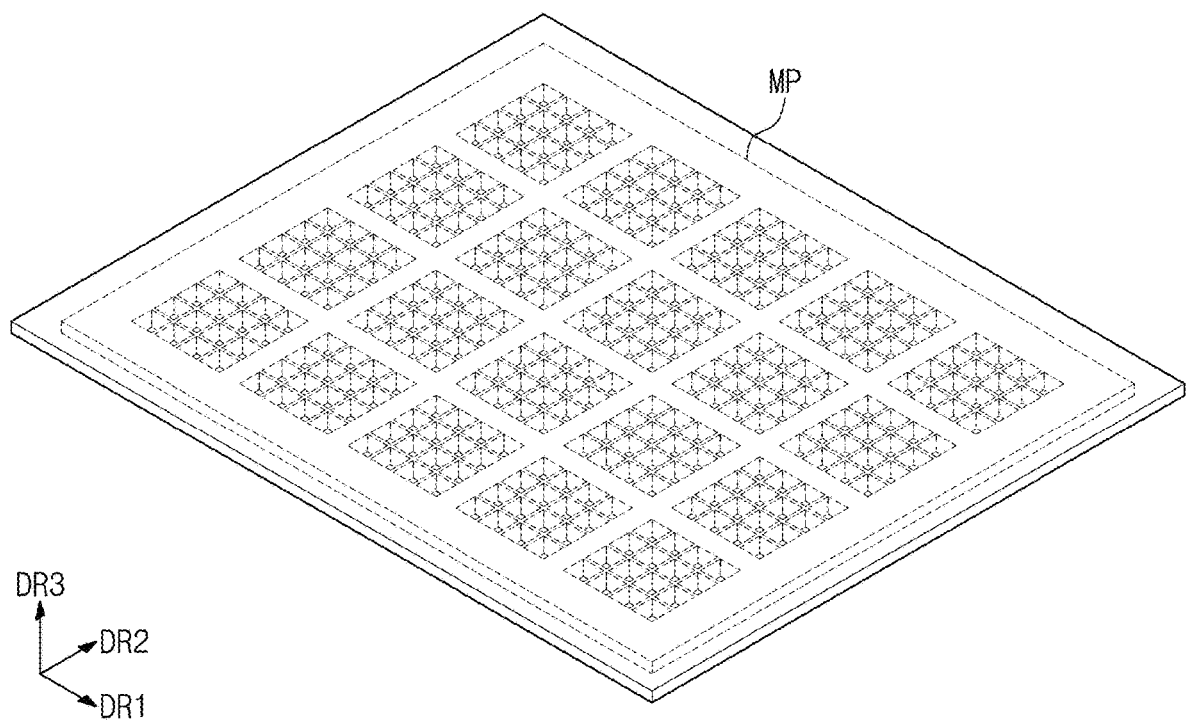
FIG. 14 is a view illustratively showing a mask manufacturing method according to an embodiment of the inventive concept.

FIG. 14 is a view illustratively showing a mask manufacturing method according to an embodiment of the inventive concept.

Referring to FIG. 14, through the mask manufacturing method according to an embodiment of the inventive concept, a mask may be manufactured without using a separate frame MF. For example, as illustrated in FIG. 14, a mask material is provided along a mask pattern MP defined on a stage ST and then hardened, whereby a mask may be manufactured.

According to the embodiment of the inventive concept, the cell mask material is provided into the cell openings defined in the mask frame and then hardened, whereby the mask may be formed.

Although the embodiments of the present disclosure have been described, it is understood that various changes and modifications can be made by one ordinary skilled in the art within the spirit and scope of the present disclosure as hereinafter claimed. Also, the embodiments disclosed in the present disclosure are not intended to limit the technical ideas of the present disclosure, and all technical ideas within the following claims and their equivalents should be interpreted to be included in the scope of right in the present disclosure.

What is claimed is:

1. A method for manufacturing a mask, the method comprising:
providing, on a stage, a mask frame in which a plurality of cell openings is defined;
providing each of the cell openings with a cell mask material in which a second area and a plurality of first areas are defined, the second area being disposed around each of the first areas;
emitting a laser beam to the second area to harden the second area; and
removing the first areas, thereby forming a plurality of cell masks disposed in the cell openings, respectively,
wherein each of the cell masks of the plurality of cell masks includes a plurality of deposition holes defined by the removing the first areas,
the plurality of deposition holes for each cell mask of the plurality of cell masks are arranged in a first direction and a second direction orthogonal to the first direction, and each of the deposition holes is spaced apart from each other in the first direction and the second direction,
wherein the providing of the cell mask material comprises:
providing the cell openings with a first cell mask material; and
providing, on the first cell mask material, a second cell mask material which comprises a material different from the first cell mask material, and
wherein a second cell mask layer including the second cell mask material is disposed on a first cell mask layer including the first cell mask material.

2. The method of claim 1, wherein the cell mask material is attached to inner walls of the mask frame in which each of the cell openings is defined.

3. The method of claim 2, wherein deposition holes of the cell masks are defined by removing the first areas,
wherein each of the deposition holes comprises:
a first portion which defines an upper portion of the deposition hole; and
a second portion which defines a lower portion of the deposition hole,
wherein, in a plan view with reference to a thickness direction of the main frame, an area of the first portion is greater than an area of the second portion.

4. The method of claim 1, wherein, when in a cross-sectional view, a top surface of each of the plurality of cell masks is disposed coplanar with a top surface of the mask frame, and a bottom surface of each of the plurality of cell masks is disposed coplanar with a bottom surface of the mask frame, and an inner sidewall of the mask frame has a same height an outer sidewall of each of the plurality of cell masks abutting the inner sidewall of the mask frame.

5. The method of claim 1, wherein the providing of the mask frame comprises:
providing a mask frame material on the stage; and
hardening the mask frame material.

6. The method of claim 1, wherein the cell openings comprise:
a first cell opening; and
a second cell opening having an area different from an area of the first cell opening in a plan view with reference to a thickness direction of the main frame.

* * * * *